United States Patent [19]
Baker

[11] 4,410,223
[45] Oct. 18, 1983

[54] MODULE MOUNTING ASSEMBLY

[75] Inventor: Paul A. Baker, 2595 Bryden Rd., Columbus, Ohio 43209

[73] Assignee: Bell Telephone Laboratories, Incorporated, Murray Hill, N.J.

[21] Appl. No.: 289,508

[22] Filed: Aug. 3, 1981

[51] Int. Cl.³ ............................................. H01R 9/09
[52] U.S. Cl. ............................ 339/17 CF; 339/75 M
[58] Field of Search ............. 339/17 CF, 17 M, 17 N, 339/174, 75 M, 75 MP

[56] References Cited

U.S. PATENT DOCUMENTS

| | | | |
|---|---|---|---|
| 3,043,021 | 7/1962 | Thompson | 339/18 B |
| 3,290,636 | 12/1966 | Overtveld | 339/17 CF |
| 3,805,212 | 4/1974 | Landman et al. | 339/17 CF |
| 4,050,755 | 9/1977 | Hasircoglu | 339/17 CF |
| 4,130,327 | 12/1978 | Spaulding | 339/17 CF |
| 4,142,287 | 3/1979 | Grabbe | 29/628 |
| 4,155,615 | 5/1979 | Zimmerman, Jr. et al. | 339/14 L |
| 4,222,622 | 9/1980 | Griffin et al. | 339/17 CF |
| 4,341,433 | 7/1982 | Cherian et al. | 339/17 CF |

*Primary Examiner*—Neil Abrams
*Attorney, Agent, or Firm*—D. A. Marshall

[57] ABSTRACT

Apparatus for mounting an integrated circuit module (2) on a printed wiring circuit board (3). The apparatus assembly (1) comprises electrical conducting members (10) for interconnecting the module with the circuit board and an insulating base (11) transversely mounting the electrical conducting members to position quadrilateral configurations of first and second spring contacts (102, 105) in planes parallel to top and bottom surfaces of the insulating base. A one piece cover (12, 42) engages the insulating base to spring clamp the module thereon and maintain each module terminal (20) in electrical engagement with a corresponding one of the first and second spring contacts.

28 Claims, 11 Drawing Figures

MODULE MOUNTING ASSEMBLY

TECHNICAL FIELD

This invention relates to apparatus for mounting a module on a printed wiring circuit board. In particular it relates to an assembly for use in mounting an integrated circuit chip carrier device on a printed wiring circuit board and electrically interconnecting the device with circuitry of the circuit board.

BACKGROUND ART

Integrated semiconductor circuit devices, oftentimes referred to as chips, contain a variety of miniaturized electrical circuitry and are widely used on printed wiring circuit boards manufactured by the Electronics and Communications Industry to form larger composite electrical circuits. A typical chip is a relatively small and fragile device commonly mounted on a ceramic substrate called a chip carrier. Electrical conducting leads generally extend outwardly from electrical circuitry of the chip and are coupled to a plurality of metallic conducting pads positioned on the chip carrier immediately adjacent each edge thereof. The chip or the combination of the chip and the chip carrier may be hermetically sealed to form an integrated circuit chip carrier module wherein electrical connections extend from the conducting pads adjacent the edges of the module, and hereinafter referred to as terminals, to the electrical circuitry of the chip.

Connector apparatus has been developed for use in mounting integrated circuit chip carrier modules on printed wiring circuit boards and interconnecting each of the module terminals with a portion of the board circuitry. Typically, the connector apparatus utilizes spring formed electrical conducting members designed to press against the terminals of a module and maintain a satisfactory electrical connection therewith. Since the manufacturing tolerances of the terminal dimensions vary as does the thickness of the chip carrier module the connector apparatus spring conducting members must exert sufficient force against the module terminals so as not to adversely affect operation of the chip circuitry.

Various techniques have been used in the design of the connector apparatus to provide the necessary spring force. In one prior art connector, pockets projecting outward from sidewalls of the connector housing are needed to hold electrical conducting members designed to provide the required spring force. Another connector requires enlarged sidewalls having cavities located therein that hold the electrical conducting members and which are formed to allow the spring portion of a conducting member to expand outward when a hinged cover locks a module into engagement with the conducting members. Still other connector apparatus utilizes horizontally extended or high vertical sidewalls around or between and over which electrical conducting members must be formed with protective insulation to obtain the proper spring force.

Manufacturing techniques presently in common use require that chip carrier modules and their associated connector apparatus be mounted in high density arrays on a circuit board having printed wiring paths. A problem arises in the aforementioned chip carrier module connector apparatus in that the electrical conducting members spring mounting arrangements require that the connector apparatus be of such size as to limit the number of chip carrier modules that may be positioned and mounted on a circuit board. In addition, the growth in the number of electrical circuits that may be accommodated on a chip requires additional module terminals and a corresponding increase in the size of the connector apparatus. Furthermore, the inconvenience of operating hinged or screw fastened locking devices of prior art connector apparatus makes it difficult to install and remove the chip carrier modules on and from circuit boards.

Accordingly, a need exists for connector apparatus arranged to mount high density arrays of integrated multi-terminal chip carrier modules on a circuit board. A need also exists for connector apparatus arranged to mount electrical conducting members used for interconnecting a chip carrier module with the circuitry of a circuit board in such configurations as to minimize the amount of space required to mount the module on the circuit board.

SUMMARY OF THE INVENTION

The foregoing problems are solved and a technical advance is achieved by module mounting apparatus comprising an assembly for transversely mounting electrical conducting spring members to position first and second contacts in planes parallel to top and bottom surfaces of the assembly to interconnect a module with a circuit board and for maintaining the terminals of the module in electrical engagement with ones of the contacts.

In accordance with the invention, an assembly for holding a module on a circuit board and interconnecting the module with the circuit board includes electrical conducting members each comprising a generally rectangular support section of resilient spring metal with one end formed into a C-shaped spring defining a first contact and the other end formed through a reverse curve section into a cantilever spring defining a second contact opposed to the first contact.

Also in accordance with the invention, an assembly for holdling a module on a circuit board includes an insulating base transversely mounting electrical conducting members to interconnect the module with the circuit board. The mounting base comprises first and second base components formed of electrically insulative material with each base component having one surface provided with a plurality of recesses therein extending perpendicularly outward from a central longitudinal rib section toward an edge of the base component and each formed to receive an electrical conducting member. One base component is rotated and bonded to the other base component to transversely mount the electrical conducting members to form quadrilateral configurations of opposed first and second spring contacts for contacting the module and circuit board in planes parallel to top and bottom surfaces of the bonded base components.

Also in accordance with the invention, an insulating base transversely mounting electrical conducting members to form quadrilateral configurations of opposed first and second contacts comprises a generally rectangular insulating body having a pentagon configured cornerpost at each corner with projecting shoulders formed to receive a module and align the module terminals with ones of the first and second contacts. The pentagon cornerposts each have an arcuate base section on which are positioned generally octagonal configured band members with L-shaped tab sections provided to bond together first and second base components supporting ones of the electrical conducting members to form the insulating base.

Also in accordance with the invention, an assembly for mounting a module on a circuit board comprises a cover having a center section with a lanced spring cantilever and which is formed with latch means to engage an insulating base transversely mounting electrical conducting members and enable the spring cantilever to press the module onto the insulating base and maintain the module in electrical engagement with spring contacts of the electrical conducting members.

In further accordance with the invention, a cover comprising a rectangular center section with lanced spring cantilevers and leg members each extended perpendicularly to the center section and each having a latch arranged to engage L-shaped tab sections of bands used to bond together a pair of insulating base components is arranged to press a module onto the bonded base components and maintain the module terminals in electrical engagement with electrical conducting members transversely mounted in the bonded base components.

DESCRIPTION OF THE DRAWING

The foregoing as well as other objects, features and advantages of the invention, will be more apparent from a description of the drawing in which.

DESCRIPTION OF THE INVENTION

1. Apparatus Description

Figure 1:
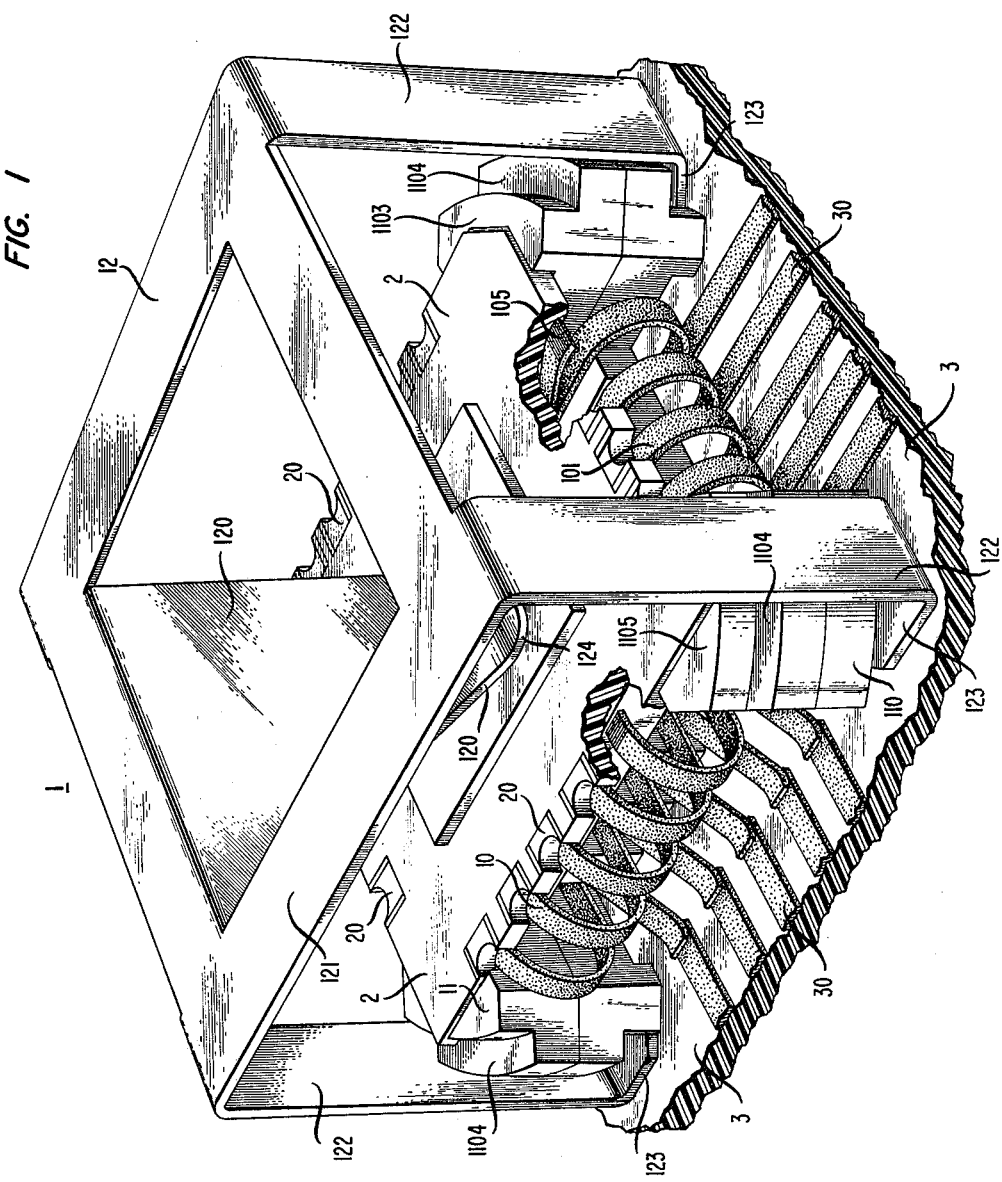
FIG. 1 is an axonometric view of exemplary module mounting apparatus embodying the principles of the instant invention.

Referring to the drawing, and more specifically to FIG. 1 of the drawing, module mounting assembly 1 set forth therein is intended for use in mounting chip carrier module 2 on printed wiring circuit board 3. Module 2 comprises a small integrated circuit chip mounted on a ceramic chip carrier. The electrical circuitry of the chip is coupled by connecting leads to a plurality of metallic terminals 20 positioned about the perimeter of the chip carrier. Typically, the chip or the combination of the chip, chip carrier and connecting leads are heremetically sealed to form module 2 wherein electrical connections are made to the electrical circuitry of the chip through terminals 20 adjacent the edges of module 2.

Module mounting assembly 1 is designed to hold module 2 on circuit board 3 and interconnect module terminals 20 via electrical conducting members 10 with conducting paths 30 of circuit board 3. In the mounting sequence insulating base 11 is positioned on circuit board 3 with each electrical conducting member 10 aligned and interconnected, for example, by soldering with a corresponding circuit board conducting path 30. Module 2 is then mounted on insulating base 11 such that module terminals 20 are aligned with electrical conducting members 10. Cover 12 having at least one lanced spring cantilever 120 is placed over module 2 and engaged with insulating base 11 such that lanced spring cantilever 120 presses module 2 onto insulating base 11 and maintains each module terminal 20 in electrical engagement with a corresponding one of electrical conducting members 10.

In another embodiment of the invention set forth in FIG. 2 of the drawing, insulating base 11 comprises a pair of insulating base components 110, hereinafter described in detail, which are bonded together by a pair of bands 13. Bands 13 are bonded together at L-shaped tabs 1301 which extend outward from insulating base 11. In the module mounting sequence, cover 42 is placed over module 2 and the leg members 422 engaged with L-shaped tabs 1301 to enable lanced spring cantilevers 420 to maintain module terminals 20 in engagement with electrical conducting members 10.

Figure 6:
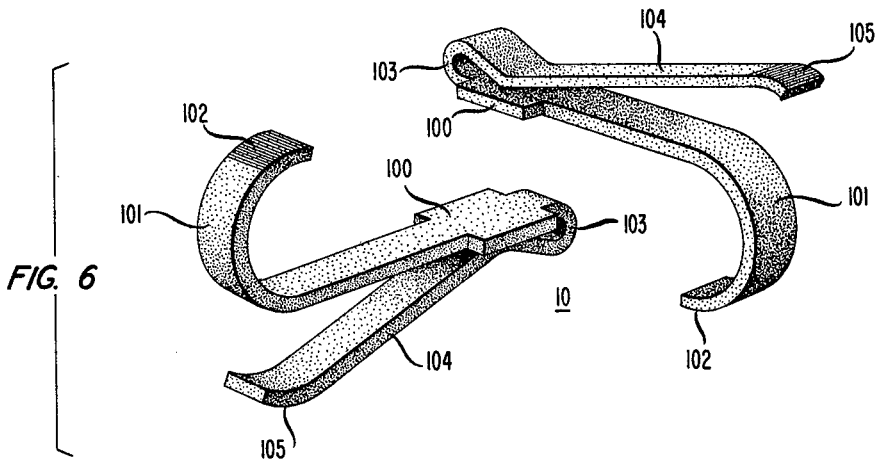
FIG. 6 is an axonometric view showing the transverse mounting relationship of one electrical conducting member with another.

Electrical conducting members 10, set forth in FIG. 6 of the drawing, are constructed of an electrical conducting material such as a beryllium copper alloy. Each is formed from a resilient spring material having a generally rectangular support section 100 with one end extended onto a C-shaped spring 101 having a first contact 102 located at the end thereof. The other end of support section 100 is formed through a reverse curve section 103 slidably meeting the underside of support section 100 and then extended into a cantilever spring 104 having an end with a second contact 105 directly opposed to first contact 101. The resulting structure is such that the spring rate of the C-shaped spring 101 of electrical conducting member 10 is equivalent to the spring rate of the combination of reverse curve section 103 and cantilever spring 104 thereby producing essentially the same deflection force for first and second contacts 102, 105 about support section 100. First and second contacts 102, 105 may be gold sputtered or electroplated onto the beryllium copper alloy or may be any other well known contact structure.

Figure 3:
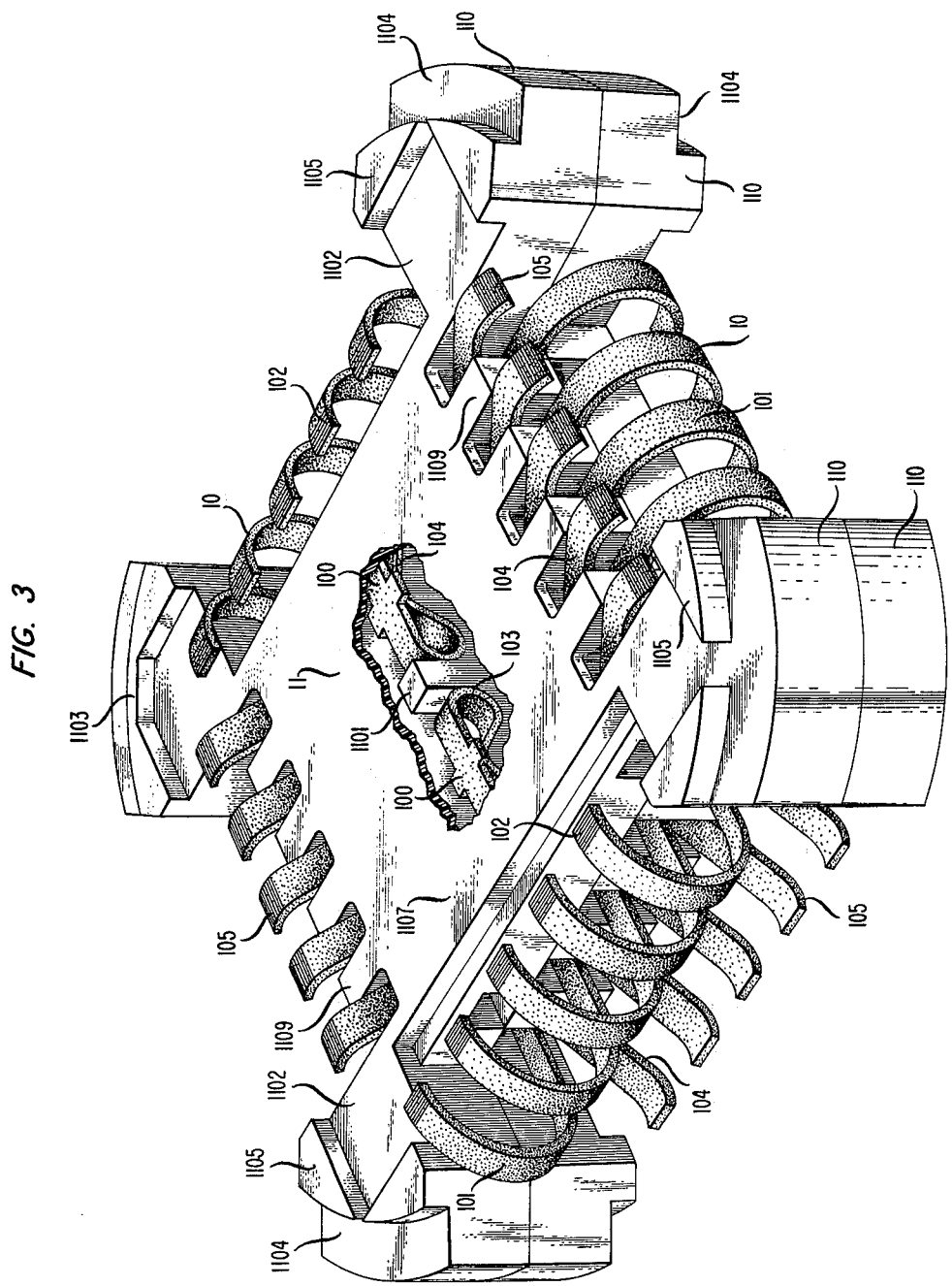
FIG. 3 is an axonometric view showing the electrical conducting member and insulating base assembly of the instant module mounting apparatus.

Referring to FIG. 3 of the drawing, insulating base 11 comprises a pair of base components 110 constructed of an electrical insulating material such as polyphenylene sulfide. Each insulating base component 110 is formed of a generally rectangular center section 1107 having a pentagon configured cornerpost 1102 formed at each corner thereof. The upper surface of either insulating base component 110 may be used to hold module 2 and align each module terminal 20 with a corresponding electrical conducting member 10. To aid in module alignment and to support insulating base 11 on a circuit board each cornerpost 1102 is provided with a pair of shoulders 1105 projecting upward from the upper surface of a base component 110 and formed at right angles with respect to each other. One pair of shoulders 1105 are joined by a module positioning guide section 1103. Projecting shoulders 1105 perform a dual function in that on one insulating base component 110 they support module mounting assembly 1 on circuit board 3 while on the adjoining insulating base member 110 they serve to receive module 2 and by use of positioning guide section 1103, align module terminals 20 with corresponding electrical conducting members 10.

Figure 5:
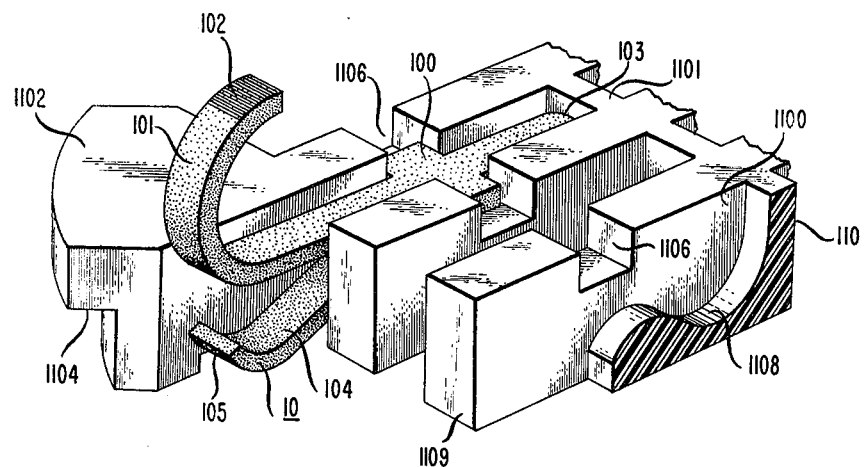
FIG. 5 is a fragmentary sectional axonometric view illustrating the mounting of electrical conducting members in a base component of the module mounting apparatus.

The lower surface of each insulating base component 110, FIG. 5, has a plurality of parallel recesses 1100 formed therein to extend perpendicularly outward from a center longitudinal rib section 1101 toward an opposing edge of base component 110. Each recess 1100 has a bottom portion 1108 contoured in the reverse curve and cantilever spring configuration of an electrical conducting member 10. In addition, rib sections 1109 separating individual recesses 1100 have a shoulder support recess 1106 aligned with adjacent shoulder support recesses 1106 to form a pair of channels, each located on one side of center longitudinal rib section 1101 and positioned parallel thereto.

Electrical conducting members 10 are assembled onto insulating base component 110 by aligning each with a recess 1100 and press fitting the shoulders of support section 100 into adjacent shoulder support recesses 1106. The electrical conducting members 10 are so positioned within insulating base component recesses 1100 such that first contacts 102 and second contacts 105 are located respectively along two opposite edges in planes located parallel to the lower and upper surfaces of insulating base component 110. Each electrical conducting member 10 is supported within a recess 1100 by support section 100 such that C-shaped spring 101 and the combination of reverse curve section 103 and cantilever spring 104 move with respect thereto to provide an equivalent deflection force for first and second contacts 102, 105. The bottom portion 1108 configuration of recess 1100 allows movement of both reverse curve section 103 and cantilever spring 104 with respect to support section 100 and enables the section joining both to slidably move along the bottom surface of support section 100.

A pair of insulating base components 110 each having two rows of electrical conducting members 10 mounted therein, FIG. 3, are assembled together to form insulating base 11. In the assembly sequence, one insulating base component 110 is positioned with the bottom surface facing and aligned with the bottom surface of another insulating base component 110. One is then rotated 90 degrees with respect to the other and the two bottom surfaces bonded together using any of a number of well-known techniques, for example, thermal bonding, to form insulating base 11.

The rotation of insulating base components 110 results in the set of electrical conducting members 10 located in one insulating base component 110 being transversely mounted within an assembled insulating base 11 with respect to the set of electrical conducting members 10 located in the adjoining insulating base component 110. Transversely mounting electrical conducting members 10 positions combinations of first and second contacts 102, 105, in planes parallel to top and bottom surfaces of the assembled insulating base 11.

Referring again to FIG. 3 of the drawing, the C-shaped springs 101 of electrical conducting members 10 located in the lower insulating base component 110 extend outward from two sides thereof and curve upward and over the upper insulating base component 110 to position two rows of contacts 102 along opposing edges and in a plane above and parallel to the upper surface of assembled insulating base 11.

The cantilever springs 104 of each of these electrical conducting members 10 slope downward and extend between the lower insulating base component rib sections 1109 to position second contacts 105 directly under corresponding first contacts 102 and in a plane located below and parallel to the lower surface of assembled insulating base 11. Similarly, cantilever springs 104 and C-shaped springs 101 of electrical conducting members 10 located in the upper insulating base component 110 position two rows of first and second contacts 102, 105, respectively along opposing edges of insulating base 11 in the aforementioned planes below and above the lower and upper surfaces of insulating base 11. Rotation of one insulating base component 110 with respect to the adjoining insulating base component 110 positions ones of first and second contacts 102, 105, to form quadrilateral configurations of contacts to electrically engage, FIG. 1, module 2 and circuit board 3, respectively, in planes parallel to upper and lower surfaces of insulating base 11.

Figure 8:
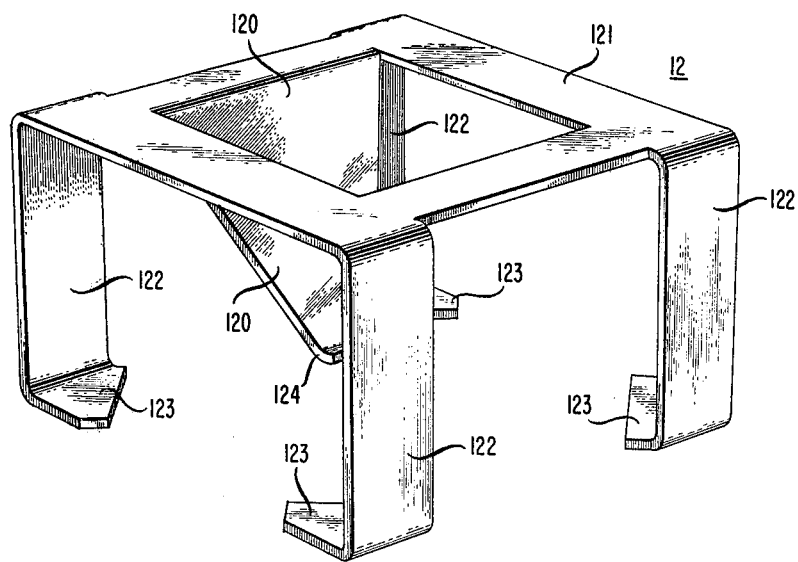
FIG. 8 is an axonometric view illustrating the one piece cover formed from the blank set forth in FIG. 7.
Figure 7:
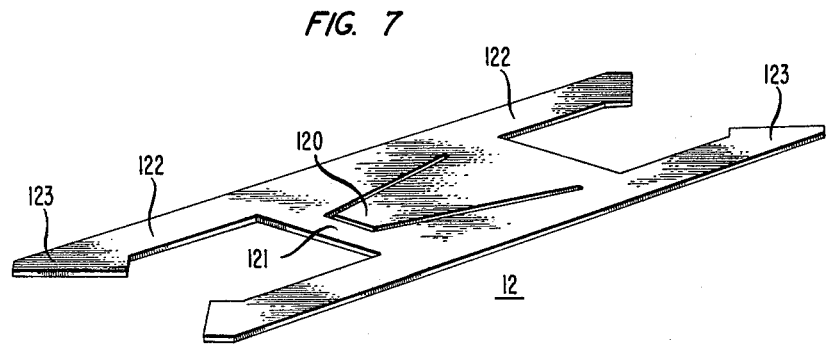
FIG. 7 is an axonometric view illustrating a blank prepared as a one piece cover for spring clamping a module onto an insulating base.

In one embodiment of the invention cover 12 used for spring clamping module 2 onto insulating base 11 may be produced by simply punching a flat blank with a conventional punch and die into the configuration set forth in FIG. 7 of the drawing. Cover 12 basically comprises a generally rectangular center section 121 formed with at least one centrally located lanced spring cantilever 120. Leg members 122 extend from each corner of center section 121 into a latch section 123 located at each end thereof. As set forth in FIG. 8, cover 12 is formed by bending each leg member 122 downward at a right angle with respect to center section 121. Each latch section 123 is bent inward from leg member 122 at a right angle to lie in a plane parallel to center section 121. In addition, lanced spring cantilever 120 is formed downward in the manner set forth in the drawing from center section 121 with the end thereof curved slightly to form a section 124 for engaging module 2.

Module 2, FIG. 1, is mounted on an insulating base 11 positioned on circuit board 3 by aligning the module truncated corner with positioning guide 1103 and placing module 2 on the upper surface of insulating base 11. Cover 12 is placed over both module 2 and insulating base 11 and then rotated to engage latch section 123 of each leg member 122 with a corresponding arcuate base section 1104. Lanced spring cantilever 120 functions to spring clamp module 2 onto insulating base 11 and maintain each module terminal 20 in electrical engagement with a corresponding one of first and second spring contacts 102, 105.

Figure 4:
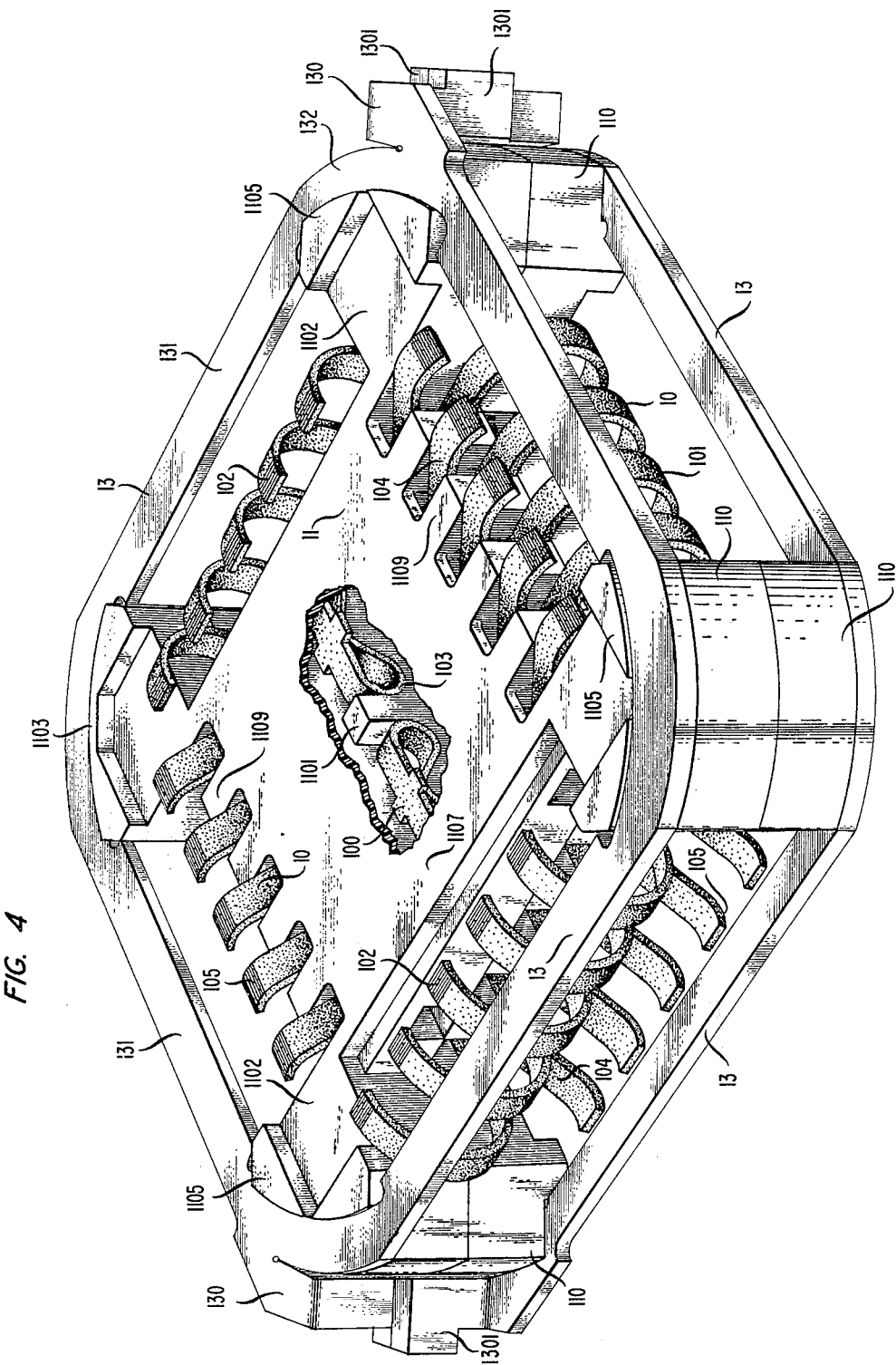
FIG. 4 is an axonometric view illustrating band members bonding first and second insulating base components together to form quadrilateral configurations of spring contacts for engaging a module and circuit board.
Figure 9:
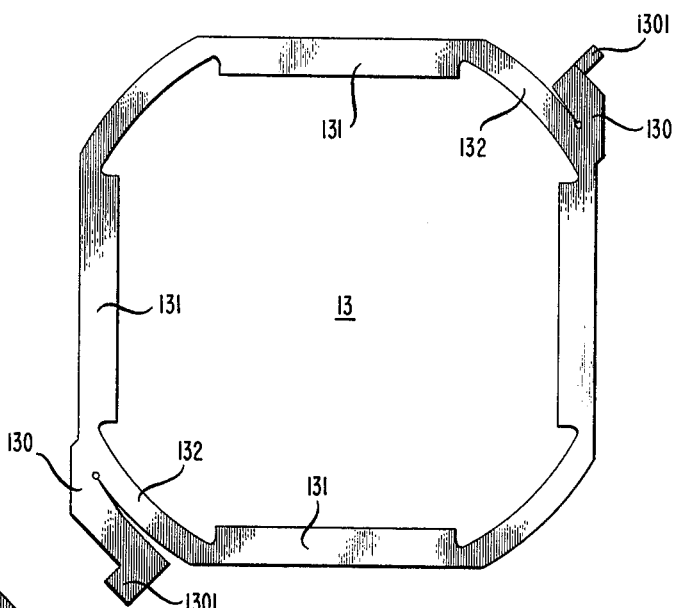
FIG. 9 is a view of a band member for securing one base component to another to form the module mounting insulating base set forth in FIGS. 2 and 4.

In another embodiment of the invention set forth in FIG. 4 of the drawing, a pair of insulating base components 110 are bonded together by a pair of bands 13. Each band 13 as set forth in detail in FIG. 9 comprises a generally octagonal configured member formed of quadrilateral support sections 131 with arcuate sections 132 connecting adjacent ones of support sections 131. An L-shaped tab section 130 is formed at the junction of a support section 131 with an adjacent arcuate section 132 at opposite corners of band 13. Although only two L-shaped tab sections 130 are set forth in FIG. 9, it is to be understood that L-shaped tab sections 130 may also be formed at each corner of band 13. Each L-shaped tab section 130 is bent downward at a right angle with respect to band 13 to form a tab 1301 that extends perpendicularly outward from a corresponding arcuate section 132.

A band 13, FIG. 4 of the drawings, is first assembled on each insulating base component 110 by pressing band 13 onto insulating base component 110 such that the band arcuate sections 132 press onto corresponding insulating base shoulders 1105 and rest on arcuate base sections 1104. A pair of insulating base components 110 are assembled into insulating base 11 by positioning the lower surfaces thereof together and rotating one insulating base component 110 90 degrees with respect to the other to transversely mount electrical conducting members 10 within the assembled insulating base 11. The rotation of insulating base components 110 aligns the tabs 130 of upper and lower bands 13 together which are subsequently spot welded to bond the pair of insulating base components 110 into insulating base 11 having first and second contacts 102, 105 positioned in planes parallel to top and bottom surfaces thereof. Although each of the bands 13 set forth in FIG. 4 is shown to have a pair of tabs 1301 it is to be understood that each arcuate section 132 of a band 13 could be formed with a tab 1301 to form a total of four tabs 1301 that can be used to bond the pair of insulating base components 110 together at each corner thereof.

Figure 10:
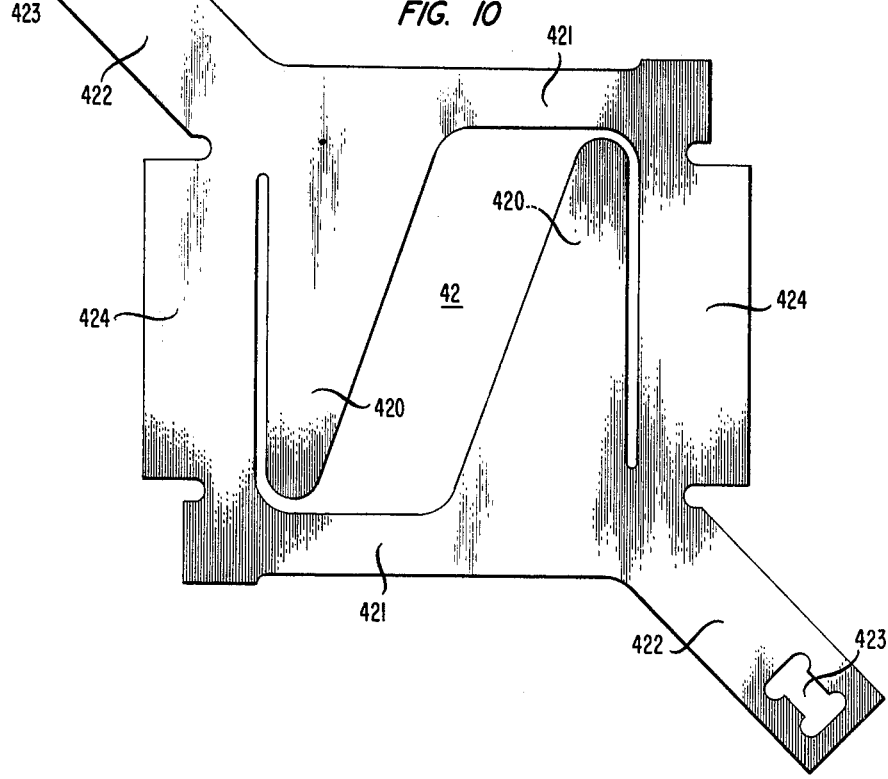
FIG. 10 is a view illustrating a blank prepared as a one piece cover intended to spring clamp a module onto an insulating base in another embodiment of the invention.

Cover 42, set forth on FIG. 10 of the drawing, may be used in combination with bands 13 to spring clamp module 2 onto insulating base 11. A flat blank is punched with a conventional punch and die to form a generally rectangular center section 421 having one or more lanced spring cantilevers 420. In addition, cover 42 may be formed with either a pair of leg members 422 located at opposite corners of rectangular center section 421 or four leg members 422 each located at a corner and extending diagonally outward therefrom. Each leg member 422 has a bone configured latch perforation 423 formed at the end thereof intended for receiving and engaging tabs 1301 of bands 13.

Figure 11:
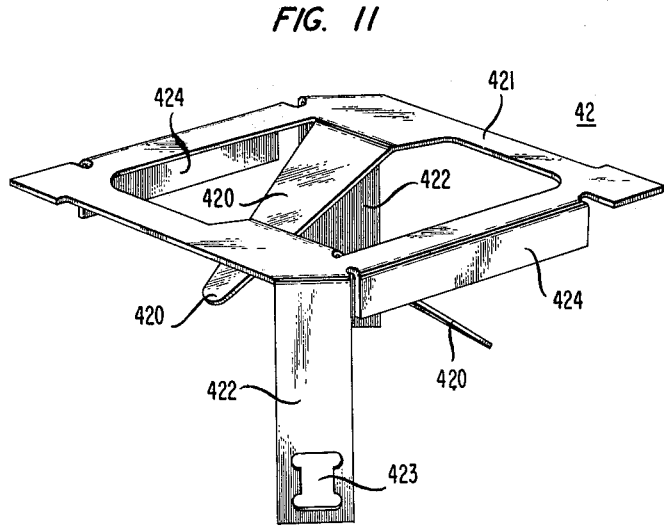
FIG. 11 is an axonomtric view illustrating the one piece cover formed from the blank set forth in FIG. 10.

Cover 42 is formed, FIG. 11 of the drawing, by bending each leg member 422 downward at a right angle with respect to center section 421. Lanced spring cantilevers 420 are positioned downward at an angle sufficient to enable the ends thereof to engage a module 2 located on insulating base 11 and side sections 424 of center section 421 are bent downward to provide strength for cover 42.

Figure 2:
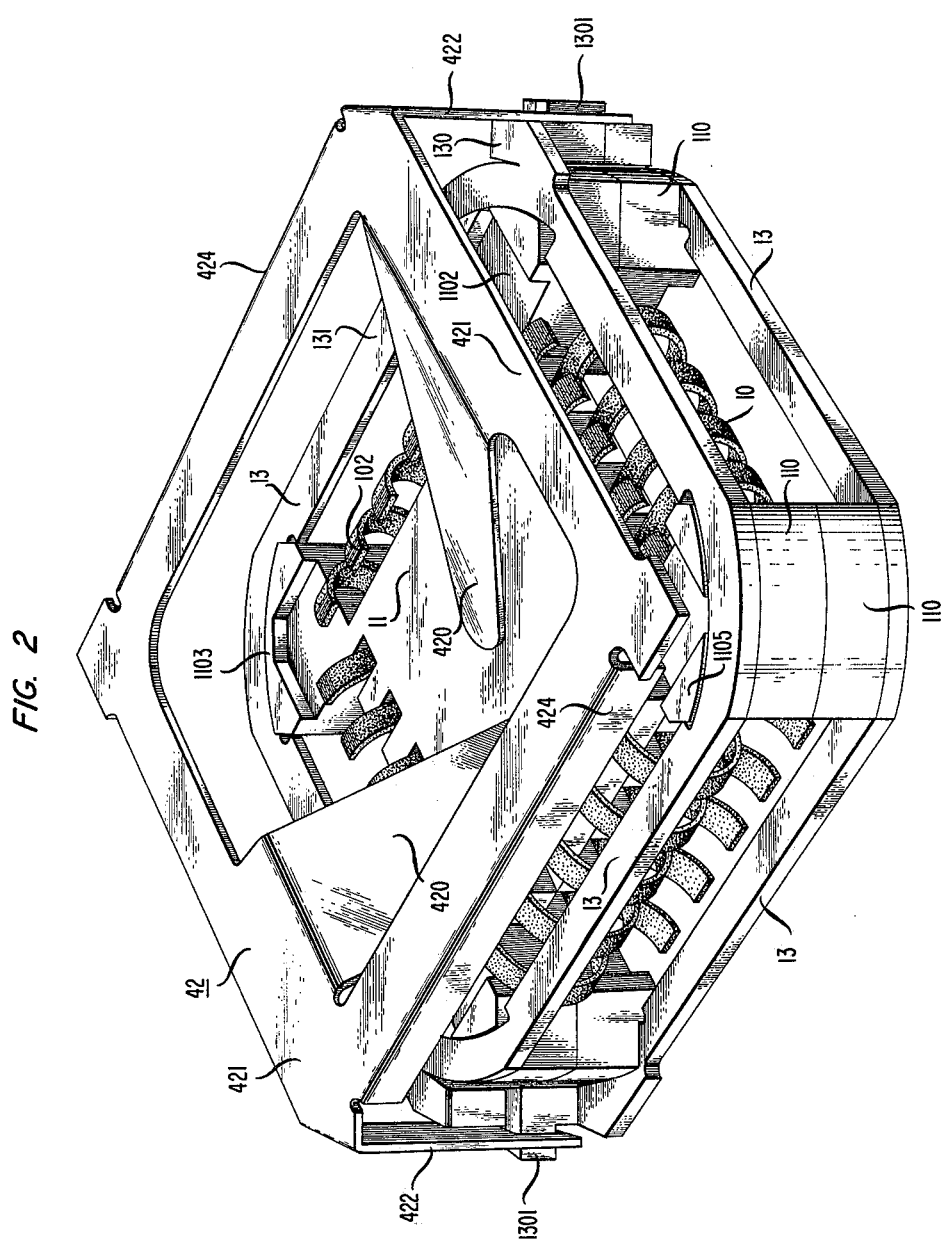
FIG. 2 is an axonometric view illustrating an assembly of the module mounting apparatus in accordance with another embodiment of the invention.

Although not shown in FIG. 2 of the drawing, module 2 is mounted on insulating base 11 such that each module terminal 20 is aligned with a corresponding first or second contact 102, 105. Cover 42 is placed over module 2 and insulating base 11 so that each leg member 422 extends downward over a corresponding L-shaped tab section 130 and thereby enable tabs 1301 of bands 13 to be press-fitted into and through latch perforation 423. The sides of latch perforation 423 engage tabs 1301 and enable lanced spring cantilevers 420 to exert a spring force against module 2 to maintain each module terminal 20 in electrical engagement with corresponding ones of first and second contacts 102, 105.

Summary

It is obvious from the foregoing that the facility, economy and efficiency of mounting integrated circuit modules on printed wiring circuit boards may be substantially enhanced by apparatus arranged to mount high density arrays of such modules on circuit boards. It is further obvious from the foregoing that module mounting apparatus arranged to transversely mount electrical conducting members to form quadrilateral configurations of spring contacts in planes parallel to top and bottom surfaces of the mounting apparatus for electrically interconnecting the module with the circuit board minimizes the amount of space required to mount a module on a circuit board and thereby enables high density arrays of modules to be mounted on the circuit board.

What is claimed is:

1. Apparatus for mounting a module with terminals on a circuit board, said apparatus comprising:
   an assembly (1) for holding the module (2) and interconnecting the terminals (20) thereof with the circuit board (3)
   characterized in that
   said assembly comprises
   electrical conducting spring members (10) having opposing first and second contacts (102, 105) for contacting the module and circuit board,
   means (11) for transversely mounting ones of said electrical conducting spring members in rows parallel to top and bottom surfaces of said mounting means wherein each said electrical conducting spring member extends along and outward from one of a pair of traverse center longitudinal ribs toward opposed edges of said mounting means with each said electrical conducting spring member positioned in a spaced apart relationship extending across and overlapping other said electrical conducting spring members along lines perpendicular to said top and bottom surfaces to position said first and second contacts in planes parallel to said top and bottom surfaces of said mounting means and outward of said center rib from which each said conducting spring member extends, and
   means (12, 42) for engaging the module terminals in electrical contact with ones of said first and second contacts.

2. The module mounting apparatus of claim 1 characterized in that
   said electrical conducting spring members comprise
   a plurality of generally rectangular resilient members each having one end formed into a first spring contact (102) and the other end formed through a reverse curved section into a second spring contact (105) opposed to said first spring contact.

3. The module mounting apparatus of claim 2 characterized in that
   said mounting means comprise
   a pair of insulating base components (110) each having a plurality of parallel recesses (1100) formed for receiving and supporting said electrical conducting spring members.

4. The module mounting apparatus of claim 3 characterized in that
   said mounting means comprises
   one of said insulating base components bonded to said other insulating base component to transversely mount ones of said electrical conducting spring members in said spaced apart relationship overlapping other said electrical conducting spring members to form quadrilateral configurations of said first and second spring contacts in said parallel planes.

5. The module mounting apparatus of claim 4 characterized in that
said engaging means comprise
cover means (12, 42) having a center section (121, 421) with at least one lanced cantilever member (120, 420) and formed with latch means (123, 423) for engaging said mounting means to enable said cantilever member to press the module onto said mounting means and maintain each module terminal in electrical engagement with a corresponding one of said first and second spring contacts.

6. Apparatus for mounting a module with terminals on a circuit board, said apparatus comprising
an assembly (1) for holding the module (2) and interconnecting the terminals (20) thereof with the circuit board (3)
characterized in that
said assembly comprises
a plurality of electrical conducting members (10) each having a support section (100) with one end formed into a first spring contact (102) and the other end formed into a second spring contact (105) opposed to said first spring contact,
insulating means (11) for transversely mounting said support sections of ones of said electrical conducting members in rows parallel to top and bottom surfaces of said insulating means wherein each said electrical conducting member extends outward from said support sections located adjacent only a pair of traverse center longitudinal rib sections toward opposed edges of said insulating means with each said electrical conducting member positioned in a spaced apart relationship extending across and overlapping other said electrical conducting members along lines perpendicular to said top and bottom surfaces to form quadrilateral configurations of said first and second spring contacts in planes parallel to said top and bottom surfaces of said insulating means and outward of said center rib from which each said conducting spring member extends for contacting the module terminals and circuit board, and
means (12, 42) for engaging said insulating means to spring clamp the module onto said insulating means and maintain each module terminal in electrical engagement with a corresponding one of said first and second spring contacts.

7. The module mounting apparatus of claim 6 characterized in that
said electrical conducting members each comprise a generally rectangular support section (100) of resilient spring metal with one end formed into a C-shaped spring (101) defining a first contact (102) and the other end formed through a reverse curve section (103) into a cantilever spring (104) defining a second contact (105) opposed to said first contact.

8. The module mounting apparatus of claim 7 characterized in that
said insulating means comprise first and second base components (110) formed of electrically insulative material and each having an upper and lower surface, said lower surface having a plurality of recesses (1100) therein extending perpendicularly outward from a center longitudinal rib section (1101) toward an edge thereof and each formed to receive one of said electrical conducting members.

9. The module mounting apparatus of claim 8 characterized in that
said base component recesses are each formed for supporting said electrical conducting member to enable said cantilever spring to extend said second contact into a plane above and parallel to said base component upper surface.

10. The module mounting apparatus of claim 9 characterized in that
said first and second base components each comprise a generally rectangular center section (1107) having a cornerpost (1102) formed at each corner thereof, said cornerpost having shoulders (1105) projecting from an upper surface thereof formed to receive the module and align the module terminals with corresponding ones of said first and second contacts.

11. The module mounting apparatus of claim 10 characterized in that
said insulating means comprises said first base component rotated and bonded to said second base component to transversely mount said electrical conducting members to form quadrilateral configurations of said first and second contacts positioned in parallel planes above and below the surfaces of said bonded base components.

12. The module mounting apparatus of claim 11 characterized in that
said engaging means comprises a one piece cover (12, 42) having a rectangular center section (121, 421) with lanced spring cantilevers (120, 420) and leg members (122, 422) having end latch means (123, 423) for engaging said base component cornerposts and enabling said lanced spring cantilevers to press the module onto said bonded base components and maintain each module terminal in electrical engagement with a corresponding one of said first and second contacts.

13. The module mounting apparatus of claim 12 characterized in that
said base components each has a pentagon configured cornerpost formed at each corner thereof, said pentagon cornerposts having an arcuate base section (1104) for assembling said base component into said insulating means.

14. The module mounting apparatus of claim 13 characterized in that
said insulating means comprises band means (13) positioned on said cornerpost arcuate base sections for bonding said first base component to said second base component.

15. The module mounting apparatus of claim 14 characterized in that
said band means comprise a pair of generally octagonal configured bands formed of quadrilateral support sections (131) and arcuate sections (132) connecting adjacent ones of said support sections, said bands each having L-shaped tab sections (130) at opposing arcuate sections for bonding said pair of bands together.

16. The module mounting apparatus of claim 15 characterized in that
said cover (42) comprises a pair of leg members (422) each extended from an opposite corner of said center section (421), said leg members formed perpendicular to said center section and each having a latch perforation (423) for engaging one of said bonded band L-shaped tab sections.

17. Apparatus for mounting a module with terminals on a circuit board, said apparatus comprises an assembly (1) for holding the module (2) and interconnecting the terminals (20) thereof with the circuit board (3) characterized in that said assembly comprises a plurality of electrical conducting members (10) each comprising a generally rectangular support section (100) of residual spring metal with one end formed into a C-shaped spring (101) defining a first contact (102) and the other end formed through a reverse curve section (103) into a cantilever spring (104) defining a second contact (105) opposed to said first contact (102), a pair of base components (110) formed of electrical insulative material each having a plurality of recesses (1100) on one surface extending outward from a center longitudinal rib section (1101) toward an edge thereof and each formed to receive one of said electrical conducting members, band means (13) positioned on each of said base components and having L-shaped tab sections (130) for bonding said pair of base components together to form a base (11) transversely mounting said electrical conducting members to form quadrilateral configurations of said first and second spring contacts for contacting the module terminals and circuit board, and means (42) for engaging said L-shaped tab sections to spring clamp the module onto said base and maintain each module terminal in electrical engagement with a corresponding one of said first and second spring contacts.

18. The module mounting apparatus of claim 17 characterized in that said base components each comprise a generally rectangular center section (1107) having a cornerpost (1102) formed at each corner thereof and a pair of channels (1106) each formed on one side of said central longitudinal rib section for supporting said electrical conducting members to define an equivalent spring deflection force for said first and second spring contacts.

19. The module mounting apparatus of claim 18 characterized in that said band means comprises a pair of generally octagonal configured bands each having a pair of said L-shaped tab sections at opposing corners thereof and each pressed onto said base component cornerposts to align said L-shaped tab sections to bond together said pair of base components.

20. The module mounting apparatus of claim 19 characterized in that said engaging means comprises a one piece cover (42) having a center section (421) with cantilever springs (420) for holding the module onto said base and formed with leg members (422) having latch means (423) at the ends thereof for engaging said band L-shaped tab sections.

21. Apparatus for mounting a module on a circuit board and interconnecting terminals of the module with the circuit board, said apparatus comprising a plurality of electrical conducting spring members having opposing first and second contacts, an insulated base for transversely mounting ones of said electrical conducting spring members in rows parallel to top and bottom surfaces of said insulated bases wherein each said electrical conducting spring member extends along and outward from one of a pair of traverse center longitudinal rib sections toward opposed edges of said insulated base with each said electrical conducting spring member positioned in a spaced apart relationship extending across and overlapping other said electrical conducting spring members along lines perpendicular to said top and bottom surfaces to position quadrilateral configurations of said first and second contacts in planes parallel to said top and bottom surfaces of said insulated base and outward of said center rib from which each said conducting spring member extends, and a cover for spring clamping the module onto said insulated base and maintaining the module terminals in electrical engagement with said first and second contacts.

22. The module mounting apparatus of claim 21 wherein each of said electrical conducting spring members comprises a generally rectangular section of resilient spring metal with one end formed into a C-shaped spring defining said first contact and the other end formed through a reverse curve section into a cantilever spring defining said second contact.

23. The module mounting apparatus of claim 22 wherein said insulated base comprises a pair of base components each having a plurality of parallel recesses formed in one surface for receiving one of said electrical conducting spring members, said recesses extending perpendicularly outward from a center longitudinal rib section toward opposing edges of said base component.

24. The module mounting apparatus of claim 23 wherein each of said recesses is contoured for receiving said reverse curve section and said cantilever spring of one of said electrical conducting spring members.

25. The module mounting apparatus of claim 24 wherein said base component comprises a pair of channels each formed on one side of said center longitudinal rib section for supporting said electrical conducting spring members in said recesses such that the spring rate of the combination of said reverse curve section and cantilever spring is equivalent to the spring rate of said C-shaped spring.

26. The module mounting apparatus of claim 25 wherein said insulated base comprises a pair of bands each fitted on one of said base components for bonding said base components together to form said quadrilateral configurations of said first and second contacts.

27. The module mounting apparatus of claim 26 wherein said cover comprises a generally rectangular center section having a pair of lanced cantilever springs for holding the module on said insulated base, and leg members formed perpendicular to said center section for engaging said bands to maintain said cantilever springs in engagement with the module.

28. The module mounting apparatus of claim 27 wherein said base components each comprise a generally rectangular center section having a pentagon configured cornerpost formed at each corner thereof, said cornerpost having an arcuate base section for receiving one of said bands and having shoulders projecting therefrom for both supporting said base on the circuit board and aligning the module with ones of said first and second contacts.

* * * * *